United States Patent
Takamizawa et al.

(10) Patent No.: US 11,342,734 B2
(45) Date of Patent: May 24, 2022

(54) CIRCUIT ASSEMBLY AND ELECTRICAL JUNCTION BOX

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Shun Takamizawa, Yokkaichi (JP); Koki Uchida, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 17/054,485

(22) PCT Filed: Apr. 24, 2019

(86) PCT No.: PCT/JP2019/017415
§ 371 (c)(1),
(2) Date: Nov. 10, 2020

(87) PCT Pub. No.: WO2019/216220
PCT Pub. Date: Nov. 14, 2019

(65) Prior Publication Data
US 2021/0057895 A1    Feb. 25, 2021

(30) Foreign Application Priority Data
May 11, 2018  (JP) .............................. JP2018-092267

(51) Int. Cl.
*H05K 1/02*    (2006.01)
*H05K 1/09*    (2006.01)
(Continued)

(52) U.S. Cl.
CPC ............ *H02G 3/16* (2013.01); *H05K 1/0206* (2013.01); *H05K 1/092* (2013.01)

(58) Field of Classification Search
CPC .... H05K 3/0061; H05K 3/4046; H05K 1/092; H05K 1/0206; H05K 1/0201;
(Continued)

(56) References Cited

U.S. PATENT DOCUMENTS 5,856,911 A * 1/1999 Riley ................... H05K 1/0204
                                                361/704
10,141,182 B1 * 11/2018 Molla ................. H01L 23/3677
(Continued)

FOREIGN PATENT DOCUMENTS

JP    H9-102688 A    4/1997
JP    2008-226966 A    9/2008
(Continued)

OTHER PUBLICATIONS

International Search Report, Application No. PCT/JP2019/017415, dated Jul. 9, 2019. ISA/Japan Patent Office.

*Primary Examiner* — Hoa C Nguyen
*Assistant Examiner* — Amol H Patel
(74) *Attorney, Agent, or Firm* — Honigman LLP

(57) ABSTRACT

A circuit assembly includes: a substrate formed with a ground pattern and a through-hole; a metal member that is inserted into the through-hole and electrically connected to the ground pattern; a heat dissipation member made of metal, that is overlaid on the substrate and can be connected to an external ground potential; and conductive paste that connects the metal member and the heat dissipation member.

10 Claims, 5 Drawing Sheets

(51) Int. Cl.
*H05K 3/40* (2006.01)
*H05K 3/00* (2006.01)
*H02G 3/16* (2006.01)

(58) Field of Classification Search
CPC .... H05K 1/0215; H05K 1/021; H05K 1/0209; H05K 1/0207; H05K 7/205
See application file for complete search history.

(56) References Cited

U.S. PATENT DOCUMENTS

| | | | |
|---|---|---|---|
| 10,269,678 B1* | 4/2019 | Viswanathan | H01L 23/047 |
| 2012/0024575 A1* | 2/2012 | Zhang | H01L 23/3677 |
| | | | 174/252 |
| 2012/0326292 A1* | 12/2012 | Ohashi | H01L 23/3677 |
| | | | 257/690 |
| 2014/0268580 A1* | 9/2014 | Mass | H05K 1/0204 |
| | | | 361/720 |
| 2015/0334877 A1* | 11/2015 | Kawagoe | H01L 25/167 |
| | | | 361/709 |
| 2016/0050794 A1* | 2/2016 | Shih | H05K 3/301 |
| | | | 361/711 |

FOREIGN PATENT DOCUMENTS

| | | | |
|---|---|---|---|
| JP | 2014-99544 A | | 5/2014 |
| JP | 2014099544 A | * | 5/2014 |
| JP | 2017-5093 A | | 1/2017 |

* cited by examiner

CIRCUIT ASSEMBLY AND ELECTRICAL JUNCTION BOX

CROSS-REFERENCE TO RELATED APPLICATIONS

This application is the U.S. national stage of PCT/JP2019/017415 filed on Apr. 24, 2019, which claims priority of Japanese Patent Application No. JP 2018-092267 filed on May 11, 2018, the contents of which are incorporated herein.

TECHNICAL FIELD

The present specification discloses a technique relating to a circuit assembly and an electrical junction box.

BACKGROUND

Conventionally, a technique of connecting a ground pattern of a substrate to a ground potential outside the substrate is known. In JP 2008-226966A, screw insertion holes are formed in a printed wiring board incorporated in an electronic device and a sheet metal piece for grounding, and an exposed portion of the ground pattern is formed around the screw insertion hole of the printed wiring board. When a screw is screwed into a screw hole of a support through the screw insertion holes of the printed wiring board and the sheet metal piece, since the sheet metal piece is pressed against and is in contact with the exposed portion of the ground pattern by a head of the screw, the printed wiring board is in a ground state, and is attached and fixed to the support with the screw.

When fixing the ground pattern of the printed wiring board to the sheet metal piece for grounding with the screw, since the head of the screw is placed on a mounting surface of the printed wiring board, there is a problem that an area where components can be mounted on the printed wiring board is reduced by the size of the head of the screw.

A technique described in this specification has been completed based on the above circumstances, and an object of the present disclosure is to provide a circuit assembly and an electrical junction box that can connect the ground pattern of the substrate to the ground potential without reducing the area where the components can be mounted on the printed wiring board.

SUMMARY

The circuit assembly described in this specification includes: a substrate provided with a ground pattern and a through-hole; a metal member that is inserted into the through-hole and electrically connected to the ground pattern; a heat dissipation member made of metal, that is overlaid on the substrate and can be connected to an external ground potential; and conductive paste that connects the metal member and the heat dissipation member.

According to this configuration, the ground pattern of the substrate and the heat dissipation member can be electrically connected through the metal member, so that the ground pattern can be connected to the heat dissipation member without using a screw. This makes it possible to connect the ground pattern of the substrate to the ground potential without reducing (due to the head of the screw) the area where the components can be mounted on the substrate. Further, since it is not necessary to use a screw for connecting the ground pattern to the ground potential, it is possible to suppress stress generated in the substrate due to stress at the time of fastening the screw. Furthermore, since the metal member and the heat dissipation member are connected by the conductive paste, it is possible to increase an actual contact area as compared with contact between solids, thereby reducing electrical resistance and suppressing conduction loss.

The following aspects are preferable as embodiments of the technique described in this specification.

The metal member may have a body portion that is inserted into the through-hole and a head portion that is disposed outside the through-hole and has a diameter that is larger than a hole diameter of the through-hole, and the head portion contacts the conductive paste.

In this way, since the head portion of the metal member contacts the conductive paste, it is possible to increase the contact area between the metal member and the conductive paste, thereby reducing the electrical resistance between the metal member and the heat dissipation member and increasing thermal conductivity.

The metal member may have a body portion that is inserted into the through-hole and a head portion that is disposed outside the through-hole and has a diameter that is larger than a hole diameter of the through-hole, and the head portion is connected to the ground pattern of the substrate.

In this way, since the head portion of the metal member is connected to the ground pattern of the substrate, it is not always necessary to match dimensional accuracy of the body portion and the through-hole for connecting the body portion and the through-hole, so that the metal member and the ground pattern of the substrate can be easily connected.

A heat transfer material that thermally connects the substrate and the heat dissipation member may be provided in a region where the metal member is not disposed between the substrate and the heat dissipation member.

In this way, heat of the substrate can be dissipated from the heat dissipation member through the heat transfer material.

The ground pattern may be formed on a hole wall of the through-hole, and the hole wall of the through-hole and the metal member are connected by solder.

In this way, it is possible to connect the metal member and the ground pattern through the solder, thereby reducing the electrical resistance between the metal member and the ground pattern.

The circuit assembly includes a heat generating component that has a terminal connected to the ground pattern and generates heat when current flows through it, and the heat generating component is disposed near the metal member.

In this way, heat of the heat generating component can be dissipated from the heat dissipation member through the metal member.

An electrical junction box may include the circuit assembly and a case that covers the circuit assembly.

Advantageous Effects of Invention

According to the technique described in this specification, it is possible to connect the ground pattern of the substrate to the ground potential without reducing the area where the components can be mounted on the substrate.

DETAILED DESCRIPTION OF PREFERRED EMBODIMENTS

Embodiment 1

Figure 1:
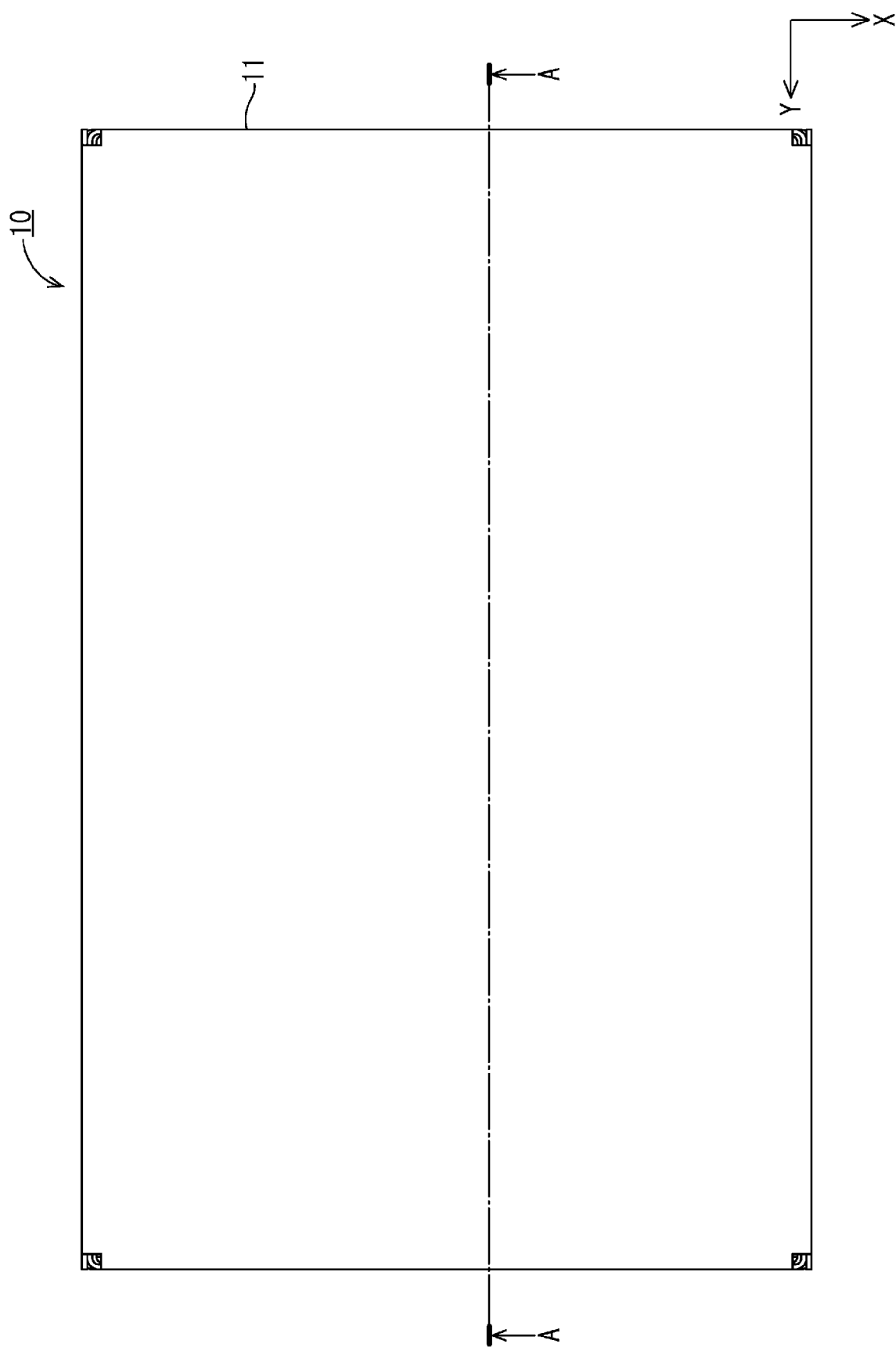
FIG. 1 is a plan view showing an electrical junction box of Embodiment 1.

Embodiment 1 will be described with reference to FIGS. 1 to 3.

An electrical junction box 10 is, for example, disposed in a power supply path between a power source, such as a vehicle battery, and a load, which may be a motor or in-vehicle electrical equipment, such as a lamp and a wiper, and can be used, for example, for a DC-DC converter, an inverter, or the like. The electrical junction box 10 can be disposed in any orientation, but in the following description, it is assumed that the X direction in FIG. 1 is the front, the Y direction is the left, and the Z direction in FIG. 2 is the upward direction.

Figure 2:
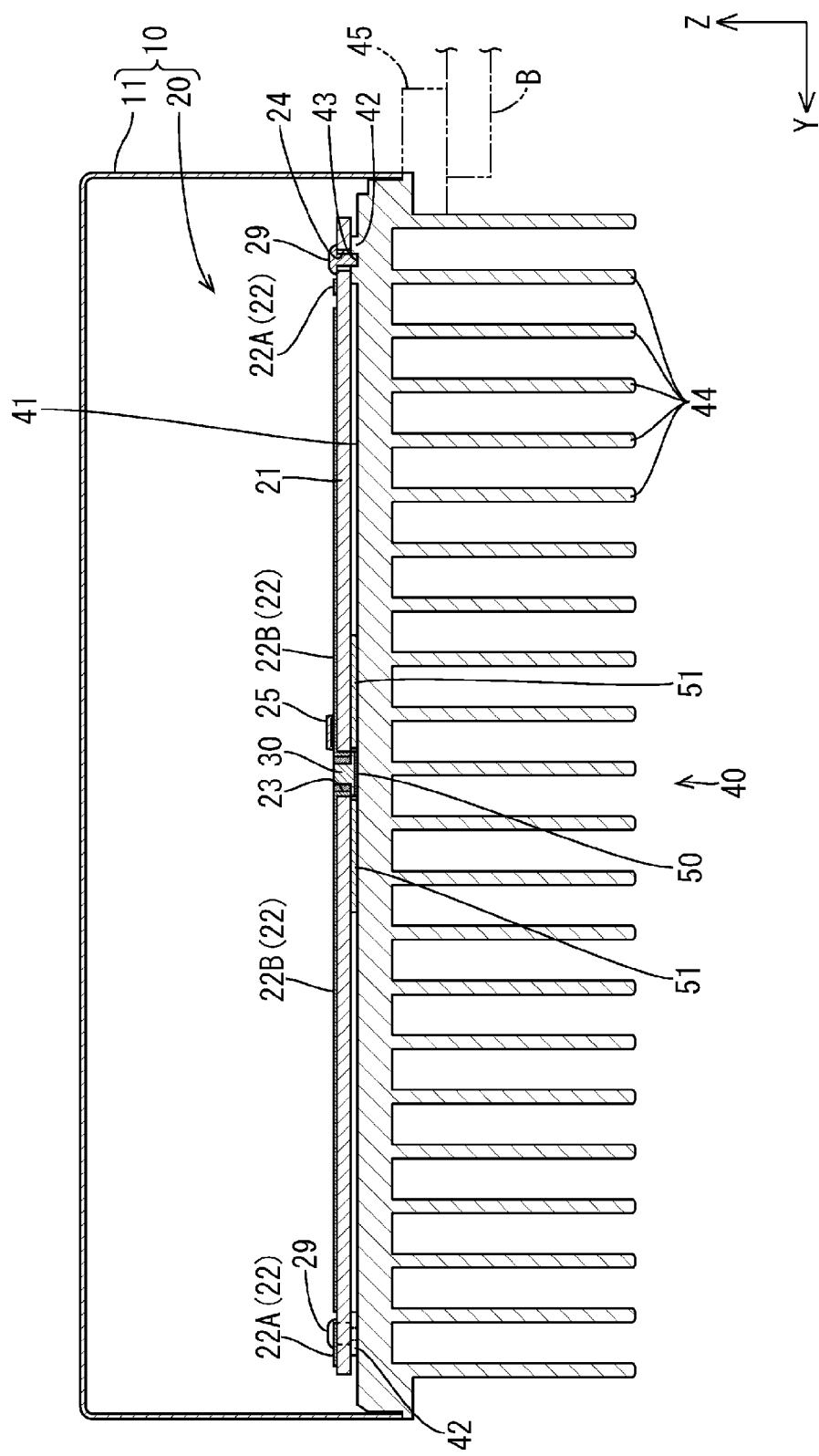
FIG. 2 is a cross-sectional view taken along a line A-A of FIG. 1.
Figure 3:
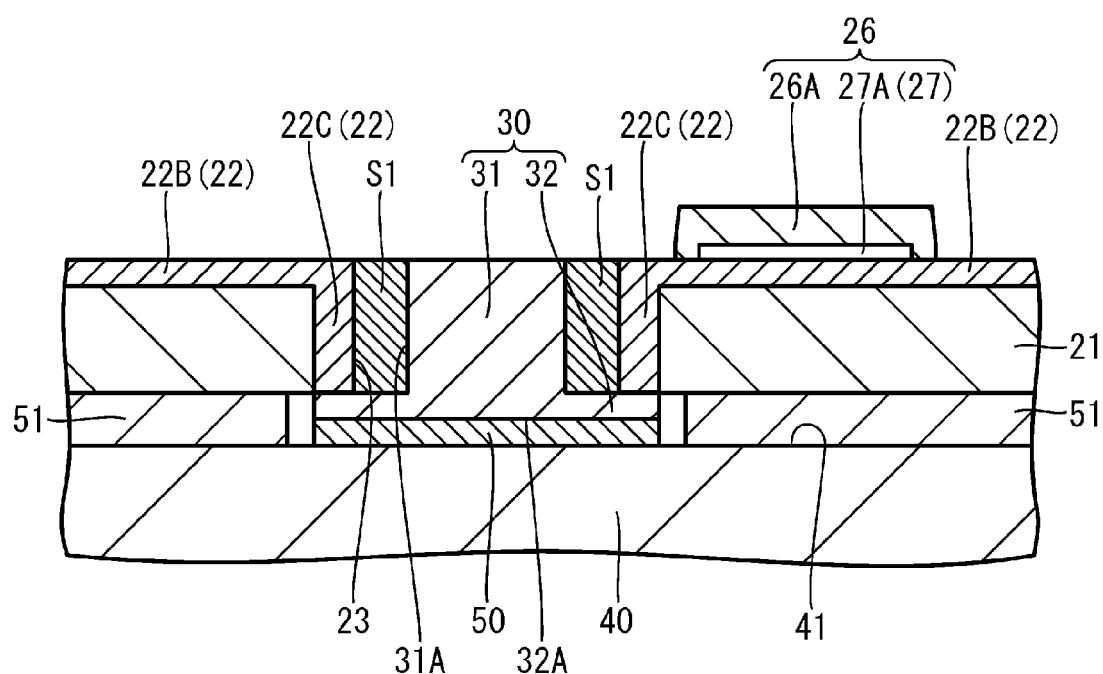
FIG. 3 is an enlarged view of the vicinity of a metal member in FIG. 2.
Figure 3:
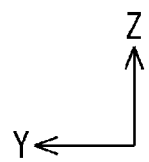

As illustrated in FIG. 2, the electrical junction box 10 includes a circuit assembly 20 and a case 11 that covers the circuit assembly 20. The case 11 has a box shape with an opening on its lower side, and is made of metal, such as aluminum and aluminum alloy, or of synthetic resin.

The circuit assembly 20 includes a substrate 21 provided with a through-hole 23 penetrating it in the vertical direction, a metal member 30 inserted in the through-hole 23 of the substrate 21, and a heat dissipation member 40 overlaid on the lower side of the substrate 21. The substrate 21 is a printed circuit board provided with a pattern 22, serving as a conductive path, made of copper foil or the like on an insulating board made of an insulating material by a printed circuit technology. The pattern 22 is wired on the upper surface of the insulating board in accordance with the route of the conductive path, and includes a power supply side pattern 22A connected to a power supply side line (for example, 5 [V]) and a ground pattern 22B connected to a ground potential (0 [V]). The power supply side pattern 22A and the ground pattern 22B are wired in different routes. In the present embodiment, the substrate 21 is provided with a single layer of the pattern 22 on the upper surface, however, the present invention is not limited to this, and for example, a multilayer substrate may also be used instead. Further, the substrate is not limited to the printed circuit board, but may also be formed by stacking a bus bar made of a metal plate material such as a copper or a copper alloy on the printed circuit board.

A heat generating component 26 is mounted on the pattern 22 of the substrate 21. The heat generating component 26 is an electronic component that generates heat when current flows through it, and as illustrated in FIG. 3, has a flat box-shaped main body 26A and a plurality of terminals 27 (one terminal 27 is illustrated in FIG. 3) formed on a bottom surface of the main body 26A. The terminals 27 include a negative terminal 27A and a positive terminal (not shown). The negative terminal 27A is electrically connected to the ground pattern 22B, and the positive terminal is electrically connected to the power supply side pattern 22A (FIG. 2). A lower surface of the terminals 27 is soldered to a land of the pattern 22 formed on the upper surface (top surface) of the substrate 21. Although the heat generating component 26 is a FET (Field Effect Transistor) in this embodiment, it may also be a heat generating component such as a resistance, a coil, or a capacitor.

The through-hole 23 extends through the substrate 21 in the vertical direction (board thickness direction). A hole wall pattern 22C made of copper foil or the like is formed on the entire surface (entire circumference) of a hole wall of the through-hole 23, and over a predetermined thickness, the hole wall pattern 22C is in intimate contact with a hole wall of the insulating board. An upper end of the hole wall pattern 22C is connected to the ground pattern 22B on the substrate 21.

The metal member 30 is, for example, made of a metal such as copper, copper alloy, aluminum, aluminum alloy, iron, and stainless steel, and has a cylindrical body portion 31 and a cylindrical head portion 32 that is provided on the lower side (one side in the axial direction) of the body portion 31 and has a diameter that is larger than that of the body portion 31. The body portion 31 has a diameter (horizontal diameter) that is smaller than a hole diameter (horizontal diameter) of the through-hole 23, and the head portion 32 has a diameter (horizontal diameter) that is larger than a hole diameter (horizontal diameter) of the through-hole 23.

When the body portion 31 is inserted into the through-hole 23, a gap is formed between an outer circumferential surface 31A of the body portion 31 and the hole wall of the through-hole 23, and the gap is filled with solder S1. The metal member 30 (and the through-hole 23) is disposed near the heat generating component 26. In this embodiment, a rivet is used as the metal member 30. As illustrated in FIG. 2, a through-hole 24 through which a shaft of a screw 29 can be inserted is formed through a peripheral edge portion of the substrate 21.

The heat dissipation member 40 is made of metals having high thermal conductivity such as aluminum or aluminum ally, and has a flat surface 41 on its upper side, and a plurality of heat dissipating fins 44 arranged side by side in a comb-like shape on its lower side. Spacers 42 are formed near a peripheral edge portion of the flat surface 41, projecting upward in a step-like manner. The spacers 42 are provided with screw holes 43 for fastening the screws 29. The heat dissipation member 40 is provided with a bracket 45 (mounting member) that can be mounted on a vehicle body B or the like, and can be connected to an external ground potential through the bracket 45. Between the flat surface 41 (upper surface) of the heat dissipation member 40 and a lower surface 32A of the head portion 32 of the metal member 30, a gap is formed in which conductive paste 50 is disposed.

The conductive paste 50 has the property of conducting electricity and the property of fixing substances to each other, and as the conductive paste 50, for example, a resin paste using fluid resin solution as a binder and containing a conductive filler such as metal powder therein can be used, and for example, a combination of epoxy resin and silver powder, glass frit, or the like can be used. The resin solution can be made of a polymer resin component and a solvent. A conductive paste that is cured at room temperature, or by heating or cooling may be used.

A heat transfer material S1 is disposed between a lower surface (surface on the heat dissipation member 40 side) of the substrate 21 and the flat surface 41 (upper surface) of the heat dissipation member 40. The heat transfer material 51 is provided in a region different from that of the metal member 30 (and the through-hole 23), and as the heat transfer material 51, for example, a material such as silicone grease having high thermal conductivity and insulation can be used. Heat of the substrate 21 is transferred to the heat dissipation member 40 through the heat transfer material 51 and is dissipated to the outside from the heat dissipation member 40.

Next, a method for manufacturing the circuit assembly 20 will be described.

The body portion 31 of the metal member 30 is inserted into the through-hole 23 of the substrate 21, and the solder S1 is filled between the hole wall of the through-hole 23 and the outer circumferential surface 31A of the body portion 31 to join the metal member 30 and the hole wall of the through-hole 23. Further, a solder paste is attached to the pattern 22, to which the terminals 27 of the heat generating component 26 are to be connected, to mount the heat generating component 26, and the metal member 30 and the heat generating component 26 are soldered to the substrate 21, for example, by reflow soldering. The reflow soldering of the terminals 27 of the heat generating component 26 and the soldering of the metal member 30 to the through-hole 23 can be performed in the same step, but may also be performed in different steps. Further, the joining by the solder S1 is not limited to reflow soldering, and for example, it is also possible to put the solder S1, melted to a liquid state, in the gap between the hole wall of the through-hole 23 and the metal member 30 and solidify the solder S1 to connect the metal member 30 and the hole wall pattern 22C.

Subsequently, the conductive paste 50 is applied to a region of the metal member 30 on the flat surface 41 of the heat dissipation member 40, and the heat transfer material 51 is applied to a region around the conductive paste 50 on the flat surface 41 (region where the conductive paste 50 is not applied). Then, when the substrate 21 is overlaid on the heat dissipation member 40 and the conductive paste 50 and the heat transfer material 51 are cured at room temperature or by heating or the like, the substrate 21 and the heat dissipation member 40 are fixed together. Then, the peripheral edge portion of the substrate 21 and the heat dissipation member 40 are fixed by fixing means such as the screws 29, so that the circuit assembly 20 is formed. Further, by covering the circuit assembly 20 with the case 11, the electrical junction box 10 is formed.

According to this embodiment, the following actions and effects are exhibited.

The circuit assembly 20 includes: the substrate 21 provided with the ground pattern 22B and the through-hole 23; the metal member 30 that is inserted into the through-hole 23 and electrically connected to the ground pattern 22B; the heat dissipation member 40 made of metal, that is overlaid on the substrate 21 and can be connected to the external ground potential; and the conductive paste 50 that connects the metal member 30 and the heat dissipation member 40.

According to this embodiment, the ground pattern 22B of the substrate 21 and the heat dissipation member 40 can be electrically connected through the metal member 30, so that the ground pattern 22B can be connected to the heat dissipation member 40 without using any screws. This makes it possible to connect the ground pattern 22B of the substrate 21 to the ground potential without reducing (due to the head of the screw) an area where components can be mounted on the substrate 21. Further, since no screw has to be used to connect the ground pattern 22B to the ground potential, it is possible to suppress the stress generated in the substrate 21 due to the stress at the time of fastening a screw. Further, since the metal member 30 and the heat dissipation member 40 are connected by the conductive paste 50, it is possible to increase an actual contact area as compared with contact between solids (metals), thereby reducing electrical resistance and suppressing conduction loss. Furthermore, it is possible to reduce the number of screw holes formed for screwing screws in the heat dissipation member 40, thereby simplifying the structure of the heat dissipation member 40.

The metal member 30 has the body portion 31 that is inserted into the through-hole 23, and the head portion 32 that is disposed outside the through-hole 23 and has a diameter that is larger than the hole diameter of the through-hole 23, and the head portion 32 contacts the conductive paste 50.

In this way, since the head portion 32 of the metal member 30 contacts the conductive paste 50, it is possible to increase the contact area between the metal member 30 and the conductive paste 50, thereby reducing the electrical resistance between the metal member 30 and the heat dissipation member 40 and increasing the thermal conductivity.

The heat transfer material 51 that thermally connects the substrate 21 and the heat dissipation member 40 is provided in a region where the metal member 30 is not disposed between the substrate 21 and the heat dissipation member 40.

In this way, the heat of the substrate 21 can be dissipated from the heat dissipation member 40 through the heat transfer material 51.

The ground pattern 22B is formed on the hole wall of the through-hole 23, and the hole wall of the through-hole 23 and the metal member 30 are connected to each other by the solder S1.

In this way, it is possible to electrically connect the metal member 30 and the ground pattern 22B through the solder S1, thereby reducing the electrical resistance between the metal member 30 and the ground pattern 22B.

The circuit assembly includes the heat generating component 26 that has the terminal 27 connected to the ground pattern 22B and generates heat when current flows through it, and the heat generating component 26 is disposed near the metal member 30.

In this way, the heat of the heat generating component 26 can be dissipated from the heat dissipation member 40 through the metal member 30.

Embodiment 2

Figure 4:
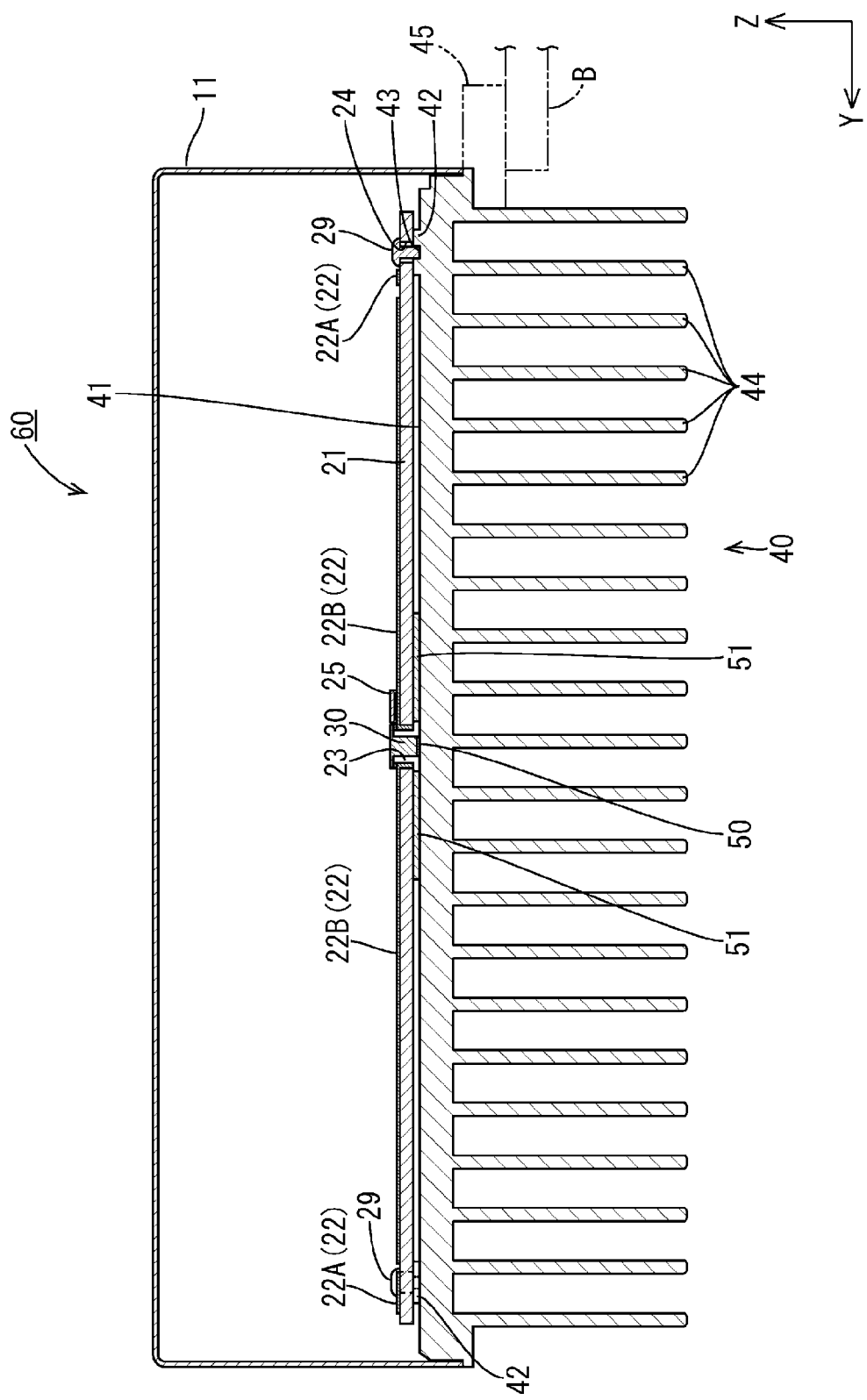
FIG. 4 is a cross-sectional view illustrating the electrical junction box of Embodiment 2.

Next, Embodiment 2 will be described with reference to FIGS. 4 and 5. In an electrical junction box 60 of Embodiment 2, as illustrated in FIG. 4, the vertical orientation of the metal member 30 is opposite to that in Embodiment 1. The same components as those in Embodiment 1 will be denoted by the same reference numerals and description thereof will be omitted below.

Figure 5:
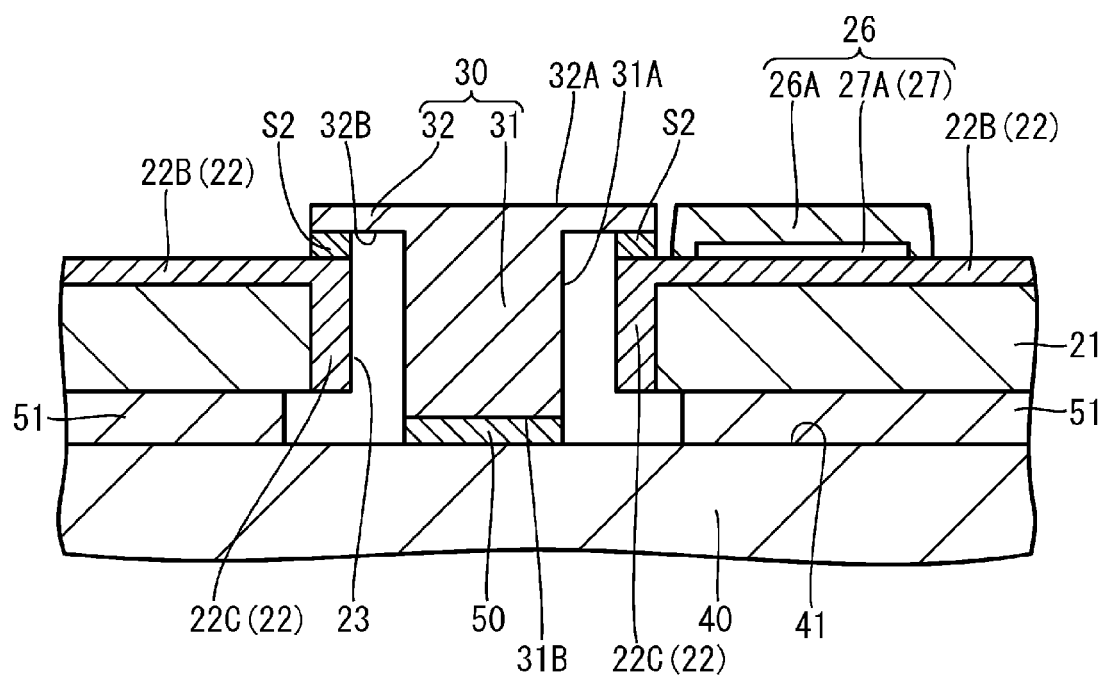
FIG. 5 is an enlarged view of the vicinity of the metal member in FIG. 4.
Figure 5:
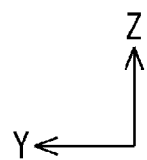

As illustrated in FIG. 5, a seat surface 32B of the head portion 32 of the metal member 30 is connected to an edge portion (upper portion of the hole wall pattern 22C) of the ground pattern 22B on the upper surface (plate surface) of the substrate 21 through solder S2. The body portion 31 of the metal member 30 is inserted into the through-hole 23 of the substrate 21 from above. Between the outer circumferential surface 31A of the body portion 31 of the metal member 30 and the hole wall of the through-hole 23, the solder S2 (S1) is not filled but an air layer (a gap) is formed. The conductive paste 50 is disposed between a lower end surface 31B of the body portion 31 and the flat surface 41 of the heat dissipation member 40, and the heat transfer material 51 is disposed around the conductive paste 50 between the substrate 21 and the heat dissipation member 40.

According to Embodiment 2, the metal member 30 has the body portion 31 that is inserted into the through-hole 23 and the head portion 32 that is disposed outside the through-hole 23 and has a diameter that is larger than the hole diameter of the through-hole 23, and the head portion 32 is soldered and connected to the ground pattern 22B of the substrate 21.

In this way, since the head portion 32 of the metal member 30 is connected to the ground pattern 22B of the substrate 21, it is not always necessary to match dimensional accuracy of the body portion 31 and the through-hole 23 to connect the body portion 31 and the through-hole 23, so that the metal member 30 and the ground pattern 22B of the substrate 21 can be easily connected.

OTHER EMBODIMENTS

The technique described in this specification is not limited to the embodiments described with the above description and drawings, but for example, the following embodiments are also included in the technical scope of the technique described in this specification.

In the embodiments, the hole wall pattern 22C is formed in the through-hole 23, but the present invention is not limited to this, and it is also possible that the hole wall pattern 22C is not formed in the through-hole 23.

The head portion 32 of the metal member 30 is not limited to a disk shape, but may also be, for example, a hemispherical shape, a spherical shape, a rectangular parallelepiped shape, or the like.

The invention claimed is:

1. A circuit assembly comprising:
   a substrate provided with a ground pattern and a through-hole;
   a metal member that is inserted into the through-hole and electrically connected to the ground pattern;
   a heat dissipation member made of metal, that is overlaid on the substrate and can be connected to an external ground potential; and
   conductive paste that connects the metal member and the heat dissipation member, wherein a heat transfer material that thermally connects the substrate and the heat dissipation member is provided in a region where the metal member is not disposed between the substrate and the heat dissipation member.

2. The circuit assembly according to claim 1, wherein the metal member has a body portion that is inserted into the through-hole and a head portion that is disposed outside the through-hole and has a diameter that is larger than a hole diameter of the through-hole, and the head portion contacts the conductive paste.

3. The circuit assembly according to claim 1, wherein the metal member has a body portion that is inserted into the through-hole and a head portion that is disposed outside the through-hole and has a diameter that is larger than a hole diameter of the through-hole, and the head portion is connected to the ground pattern of the substrate.

4. The circuit assembly according to claim 1, wherein the ground pattern is continuous with a hole wall of the through-hole, and the hole wall of the through-hole and the metal member are connected by solder.

5. The circuit assembly according to claim 1, further including:
   a heat generating component that has a terminal connected to the ground pattern and generates heat when current flows through the heat generating component, wherein
   the heat generating component is disposed near the metal member.

6. An electrical junction box comprising:
   the circuit assembly according to claim 1; and
   a case that covers the circuit assembly.

7. The electrical junction box according to claim 6, wherein the metal member has a body portion that is inserted into the through-hole and a head portion that is disposed outside the through-hole and has a diameter that is larger than a hole diameter of the through-hole, and the head portion contacts the conductive paste.

8. The electrical junction box according to claim 6, wherein the metal member has a body portion that is inserted into the through-hole and a head portion that is disposed outside the through-hole and has a diameter that is larger than a hole diameter of the through-hole, and the head portion is connected to the ground pattern of the substrate.

9. The electrical junction box according to claim 6, wherein the ground pattern is continuous with a hole wall of the through-hole, and the hole wall of the through-hole and the metal member are connected by solder.

10. The electrical junction box according to claim 6, further including:
    a heat generating component that has a terminal connected to the ground pattern and generates heat when current flows through the heat generating component, wherein the heat generating component is disposed near the metal member.

* * * * *